(12) United States Patent
Yukiyoshi

(10) Patent No.: US 8,520,405 B2
(45) Date of Patent: Aug. 27, 2013

(54) SHIELD CASE AND IMAGE DISPLAY DEVICE

(75) Inventor: Ryohaku Yukiyoshi, Kobe (JP)

(73) Assignee: SANYO Electric Co., Ltd., Moriguchi-shi, Osaka (JP)

( * ) Notice: Subject to any disclaimer, the term of this patent is extended or adjusted under 35 U.S.C. 154(b) by 202 days.

(21) Appl. No.: 12/894,812

(22) Filed: Sep. 30, 2010

(65) Prior Publication Data

US 2011/0080721 A1 Apr. 7, 2011

(30) Foreign Application Priority Data

Oct. 1, 2009 (JP) ................ 2009-229716

(51) Int. Cl.
*H05K 9/00* (2006.01)
(52) U.S. Cl.
USPC ................. 361/816; 361/799; 361/818
(58) Field of Classification Search
USPC ............. 361/799, 816, 818, 728–730, 752, 361/796, 800; 174/350
See application file for complete search history.

(56) References Cited

U.S. PATENT DOCUMENTS

| | | | | |
|---|---|---|---|---|
| 5,175,395 A | * | 12/1992 | Moore | 174/372 |
| 5,241,453 A | * | 8/1993 | Bright et al. | 361/704 |
| 5,365,410 A | * | 11/1994 | Lonka | 361/816 |
| 5,373,101 A | * | 12/1994 | Barabolak | 174/363 |
| 5,392,461 A | * | 2/1995 | Yokoyama | 455/90.2 |
| 5,717,577 A | * | 2/1998 | Mendolia et al. | 361/818 |
| 5,742,004 A | * | 4/1998 | Greco et al. | 174/372 |
| 6,049,469 A | * | 4/2000 | Hood et al. | 361/818 |
| 6,297,967 B1 | * | 10/2001 | Davidson et al. | 361/800 |
| 6,384,324 B2 | * | 5/2002 | Flegeo | 174/390 |
| 6,650,546 B2 | * | 11/2003 | Nelson et al. | 361/738 |
| 6,657,620 B2 | * | 12/2003 | Oishi et al. | 345/204 |
| 6,683,796 B2 | * | 1/2004 | Radu et al. | 361/818 |
| 7,076,230 B2 | * | 7/2006 | Nakatsuji et al. | 455/300 |
| 7,394,186 B2 | * | 7/2008 | Kim | 313/46 |
| 7,593,221 B2 | * | 9/2009 | Sheng | 361/679.35 |
| 7,830,471 B2 | * | 11/2010 | Okumura et al. | 349/59 |
| 7,952,654 B2 | * | 5/2011 | Tae et al. | 349/58 |
| 7,999,195 B2 | * | 8/2011 | Huang et al. | 174/382 |
| 8,247,707 B2 | * | 8/2012 | Li | 174/382 |
| 2009/0002594 A1 | | 1/2009 | Okumura et al. | |
| 2010/0225847 A1 | | 9/2010 | Okumura et al. | |

FOREIGN PATENT DOCUMENTS

JP 2008-218526 A 9/2008
JP 2009-009032 A 1/2009

* cited by examiner

*Primary Examiner* — Hung S Bui
(74) *Attorney, Agent, or Firm* — Westerman, Hattori, Daniels & Adrian, LLP

(57) ABSTRACT

A shield case includes at least one tongue piece which is formed of a conductor and protrudes to an outside of the shield case. Further, the shield case is formed of a conductor, and an element is housed inside the shield case.

2 Claims, 4 Drawing Sheets

SHIELD CASE AND IMAGE DISPLAY DEVICE

This application is based on Japanese Patent Application No. 2009-229716 filed on Oct. 1, 2009, the contents of which are hereby incorporated by reference.

BACKGROUND OF THE INVENTION

1. Field of the Invention

The present invention relates to a shield case for electromagnetically shielding an element housed inside the shield case, and relates to an image display device including the shield case.

2. Description of Related Art

In recent years, in a variety of electronic devices including an image display device for displaying an image, for example, by receiving television broadcasting, a structure for realizing satisfactory electro-magnetic compatibility (EMC) and satisfactory electrostatic discharge (ESD) has been adopted. Specifically, there has been adopted a structure including a shield case for electromagnetically shielding an outside of the shield case and an element housed inside the shield case, or a structure in which the shield case or a circuit board is grounded.

For example, the following shield case has been proposed. The shield case achieves improved electromagnetic shielding performance by securing contact conduction between a shield frame and a shield cover which constitute the shield case.

Further, for example, the following ground fitting for an image display device has been proposed. The ground fitting achieves satisfactory EMC of a circuit board by electrically connecting a ground pattern of the circuit board to a metal plate formed on a back surface of a liquid crystal display panel. The ground fitting is fixed to a back cabinet together with the circuit board, and the ground fitting is brought into contact with the metal plate at the time of assembly of the image display device.

However, in the above-mentioned shield case, effective shielding of the inside of the shield case is possible, whereas there is a fear in that grounding of a system including the element, the circuit board, and the shield case is not satisfactory. In this case, a part of or entire system serves as an antenna, and hence there may arise a problem in that a level of unnecessary radiation is high.

This problem can be solved by satisfactorily grounding the system with the above-mentioned ground fitting and the like. However, in a case of using those members, a new problem may arise, such as a complicated structure of an electronic device including the system, a cost increase, or a reduction in operability caused by a complicated manufacturing process.

SUMMARY OF THE INVENTION

According to the present invention, a shield case includes at least one tongue piece which is formed of a conductor and protrudes to an outside of the shield case, in which the shield case is formed of a conductor and an element is housed inside the shield case.

According to the present invention, an image display device includes: the shield case; the element; the circuit board; and a display panel including a ground conductor formed on at least a part of a back surface, for displaying an image on a front surface, in which the back surface of the display panel and a surface of the shield case on which the at least one tongue piece is formed are provided to be opposed to each other, and in which the at least one tongue piece is brought into contact with the ground conductor.

DETAILED DESCRIPTION OF PREFERRED EMBODIMENT

The significance and effect of the present invention become more apparent from the following description of an embodiment. It is to be understood that the significance of the present invention and the significance of terms describing component elements thereof are not limited in any way by those described in the following embodiment, because the following embodiment is merely an example of how the present invention can be implemented.

<Shield Case>

Figure 1:
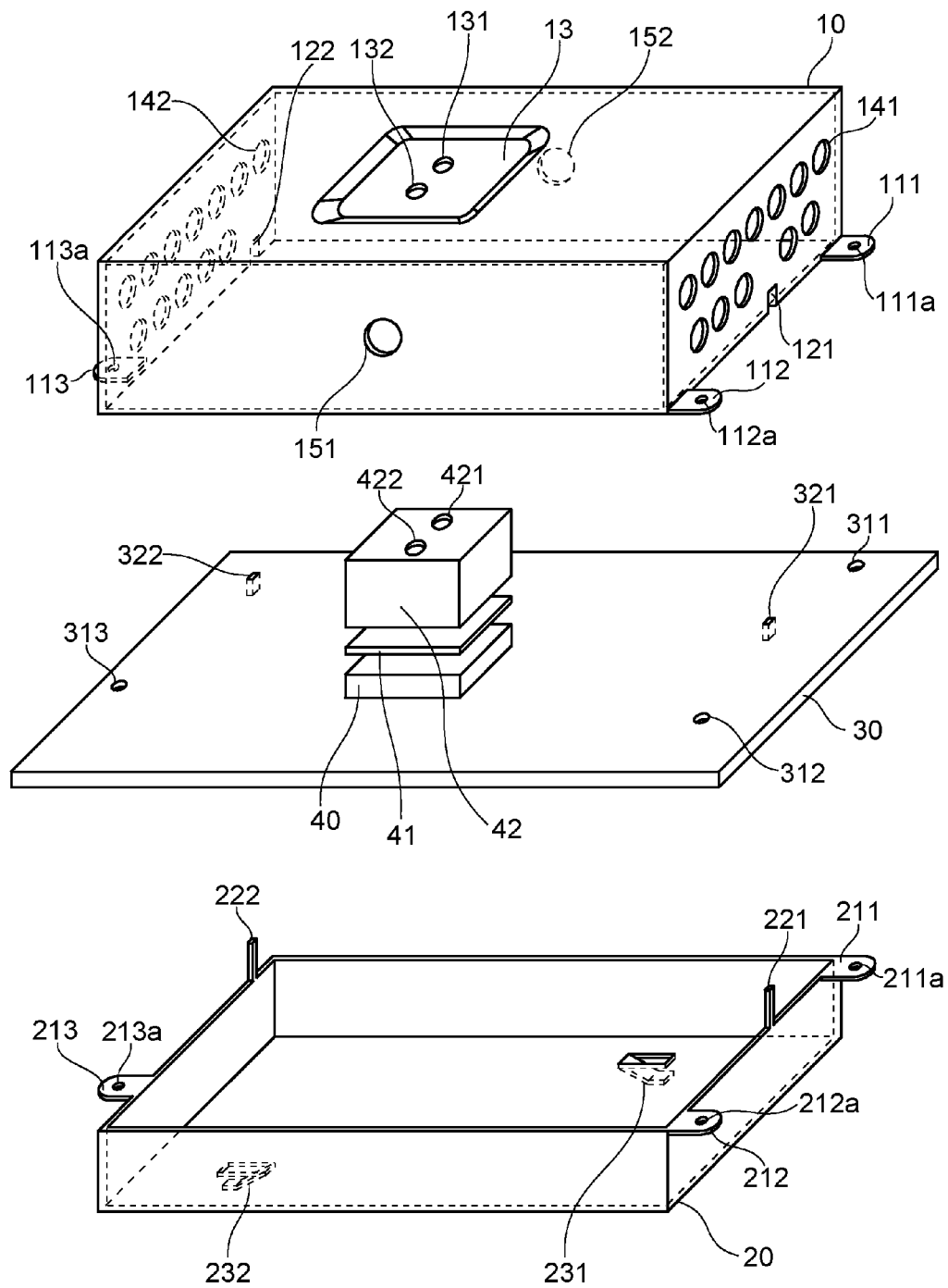
FIG. 1 is an exploded perspective view illustrating a structure of a shield case according to an embodiment of the present invention.

First, a structure of a shield case according to the embodiment of the present invention is described with reference to FIG. 1. FIG. 1 is an exploded perspective view illustrating the structure of the shield case according to the embodiment of the present invention.

As illustrated in FIG. 1, the shield case according to the embodiment of the present invention includes an upper case 10 and a lower case 20. The upper case 10 has a substantially rectangular parallelepiped box-shape with an opened lower surface, and the lower case 20 has a substantially rectangular parallelepiped box-shape with an opened upper surface. Further, each of the upper case 10 and the lower case 20 is formed of a conductor in order to electromagnetically shield an inside of the shield case and ground the shield case.

The upper case 10 and the lower case 20 are provided to sandwich, from above and below, a circuit board 30 such as a printed circuit board (PCB) on which an element 40 such as an integrated circuit (IC) is provided, the element 40 being housed inside the upper case 10 and the lower case 20. Specifically, the element 40 is provided on, for example, an upper surface of the circuit board 30, and the upper case 10 is provided so as to house the element 40 therein so that a lower surface of the upper case 10 is brought into contact with the upper surface of the circuit board 30. Further, the lower case 20 is provided so that an upper surface of the lower case 20 is brought into contact with a lower surface of the circuit board 30. Note that, the lower surface of the upper case 10 and the upper surface of the lower case 20 are formed into a substantially equal shape.

At two substantially parallel short sides of the lower surface of the upper case 10, there are provided case coupling portions 111 to 113 protruding outward so as to be substantially parallel to the lower surface and substantially perpendicular to the short sides. The case coupling portions 111 and 112 are provided at the same short side, and the case coupling portion 113 is provided at the short side different from the short side at which the case coupling portions 111 and 112 are provided. Further, the case coupling portions 111 and 112 are provided at end portions of the short side, respectively, and the case coupling portion 113 is provided at a position away from end portions of another short side. Further, the case coupling portions 111 to 113 are respectively provided with screw holes 111a to 113a. A screw is inserted through each of the screw holes 111a to 113a downward from above.

In addition, in side surfaces including the short sides of the upper case 10, there are formed cutout portions 121 and 122 which are cut out upward from the lower surface and are substantially perpendicular to the lower surface. The cutout portion 121 is formed at a position away from the case coupling portions 111 and 112 and in the side surface including the short side at which the case coupling portions 111 and 112 are provided. Further, the cutout portion 122 is formed at a position away from the case coupling portion 113 and in the side surface including the short side at which the case coupling portion 113 is provided.

At two substantially parallel short sides of the upper surface of the lower case 20, there are provided case coupling portions 211 to 213 protruding outward so as to be substantially parallel to the upper surface and substantially perpendicular to the short sides. The case coupling portions 211 and 212 are provided at the same short side, and the case coupling portion 213 is provided at the short side different from the short side at which the case coupling portions 211 and 212 are provided. Further, the case coupling portions 211 and 212 are provided at end portions of the short side, respectively, and the case coupling portion 213 is provided at a position away from end portions of another short side. Further, the case coupling portions 211 to 213 are respectively provided with screw holes 211a to 213a. A screw is inserted through each of the screw holes 211a to 213a downward from above.

In addition, at the short sides of the upper surface of the lower case 20, there are respectively provided protrusions 221 and 222 which protrude upward and are substantially perpendicular to the upper surface. The protrusion 221 is provided at a position away from the case coupling portions 211 and 212 and at the short side at which the case coupling portions 211 and 212 are provided. The protrusion 222 is provided at a position away from the case coupling portion 213 and at the short side at which the case coupling portion 213 is provided.

Insertion holes 321 and 322 are formed in the circuit board 30. The insertion hole 321 has a corresponding positional relation with the protrusion 221, and the insertion hole 322 has a corresponding positional relation with the protrusion 222. Specifically, in the corresponding positional relations, when the protrusion 221 is inserted into the insertion hole 321, the protrusion 222 is also allowed to be inserted into the insertion hole 322. Similarly, corresponding positional relations are established between the protrusion 221 and the cutout portion 121 and between the protrusion 222 and the cutout portion 122. Specifically, in the corresponding positional relations, when the protrusion 221 is fitted into the cutout portion 121, the protrusion 222 is also allowed to be fitted into the cutout portion 122.

That is, the protrusions 221 and 222 of the lower case 20 are inserted into the insertion holes 321 and 322 of the circuit board 30, respectively, and the protrusions 221 and 222 respectively protruding from the insertion holes 321 and 322 are further fitted into the cutout portions 121 and 122 of the upper case 10, respectively. As a result, it is possible to establish one relative positional relation among the lower case 20, the circuit board 30, and the upper case 10.

Further, screw holes 311 to 313 are formed in the circuit board 30. A screw is inserted through each of the screw holes 311 to 313 downward from above. When the above-mentioned one positional relation is established among the lower case 20, the circuit board 30, and the upper case 10, the screw hole 111a, the screw hole 311, and the screw hole 211a are aligned with one another in an up-down direction. Similarly, the screw hole 112a, the screw hole 312, and the screw hole 212a are aligned with one another in the up-down direction, and the screw hole 113a, the screw hole 313, and the screw hole 213a are aligned with one another in the up-down direction.

With the above-mentioned structure, the upper case 10 and the lower case 20 can be fixed to the circuit board 30, for example, as in the following method. In the method according to this embodiment, first, the protrusions 221 and 222 of the lower case 20 are inserted into the insertion holes 321 and 322 of the circuit board 30, respectively. Then, the lower case 20 and the circuit board 30 are soldered to each other. At this time, a ground pattern of the circuit board 30 and the lower case 20 may be electrically connected to each other by soldering as needed.

Next, the cutout portions 121 and 122 of the upper case 10 are respectively fitted onto the protrusions 221 and 222 protruding from the insertion holes 321 and 322 of the circuit board 30. Then, the screw hole 111a, the screw hole 311, and the screw hole 211a are fixed to one another with a screw, and the screw hole 112a, the screw hole 312, and the screw hole 212a are fixed to one another with a screw. Further, the screw hole 113a, the screw hole 313, and the screw hole 213a are fixed to one another with a screw. In this way, the upper case 10 is fixed to the circuit board 30 and the lower case 20. At this time, a ground pattern of the circuit board 30 and the upper case 10 may be electrically connected to each other by soldering as needed. In the above-mentioned way, the upper case 10 and the lower case 20 can be fixed to the circuit board 30.

By the way, a heat radiating sheet 41 is provided on an upper surface of the element 40, and a heat radiating plate 42 is further provided on the upper surface thereof. In an upper surface of the heat radiating plate 42, there are formed two screw holes 421 and 422 through which screws are respectively inserted from above. The upper surface of the upper case 10 is provided with a heat radiating plate fixing portion 13 recessed relative to a periphery of the heat radiating plate fixing portion 13. In the heat radiating plate fixing portion 13, there are formed two screw holes 131 and 132 through which screws are respectively inserted downward from above. Corresponding positional relations are established between the screw hole 421 and the screw hole 131 and between the screw hole 422 and the screw hole 132. Specifically, in the corresponding positional relations, when the screw hole 421 and the screw hole 131 are fixed to each other with a screw, the screw hole 422 and the screw hole 132 can be fixed to each other with a screw.

A plurality of through-holes 141 are formed in one of two side surfaces including the short sides of the upper case 10, and a plurality of through-holes 142 are formed in the other of the two side surfaces. The through-holes 141 and 142 are formed for communicating an inside of the upper case 10 to an outside thereof, for example, for the purpose of heat radiation. Further, one through-hole 151 is formed in one of two side surfaces including long sides of the upper case 10, and one through-hole 152 is formed in the other of the two side surfaces. The through-holes 151 and 152 are formed for communicating the inside of the upper case 10 to the outside thereof, for example, for the purpose of checking a state of the inside of the upper case 10 after the upper case 10 is fixed to the circuit board 30 and the lower case 20.

Further, the lower surface of the lower case 20 is provided with tongue pieces 231 and 232 protruding to an outside of the lower case 20 (downward). The tongue pieces 231 and 232 ground the shield case through contact with a ground conductor (not shown, a specific example thereof is described below).

FIG. 1 illustrates an example in which the two tongue pieces 231 and 232 are provided apart from each other on a substantially diagonal line on the substantially rectangular lower surface of the lower case 20. Note that, it is possible to appropriately change the number of the tongue pieces 231 and 232 and where to provide the tongue pieces. However, it is preferred to determine the number of the tongue pieces 231 and 232 and where to provide the tongue pieces in consideration of an amount of operation for providing the tongue pieces 231 and 232 and contact performance with respect to the ground conductor.

Figure 2:
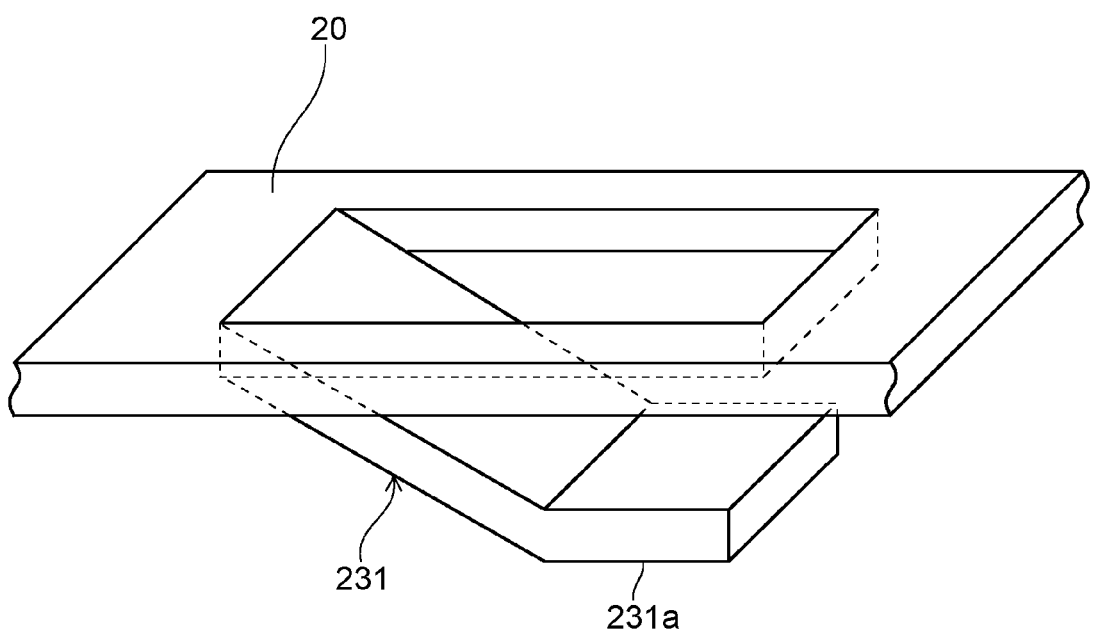
FIG. 2 is a perspective view illustrating a main part of a structure of a tongue piece of the shield case according to the embodiment of the present invention.

The tongue pieces 231 and 232 are further described in detail with reference to FIG. 2. FIG. 2 is a perspective view illustrating a main part of a structure of the tongue piece of the shield case according to the embodiment of the present invention, and illustrating the tongue piece 231 of FIG. 1 as a representative. As illustrated in FIG. 2, the tongue piece 231 is formed by cutting a part of the lower surface of the lower case 20 and then bending the cut part outward (downward). For example, some rectangular region on the lower surface of the lower case 20 is cut along three sides of the rectangular region while one side of the rectangular region remains uncut, and then, the thus cut rectangular region is bent outward (downward) along the one side as a crease, to thereby form the tongue piece 231. Note that, as illustrated in FIG. 1, the one side serving as the crease may be a side on a center side of the lower surface of the lower case 20.

In addition, as illustrated in FIG. 2, a distal end portion 231a as a distal end of the tongue piece 231 is formed by bending the tongue piece 231. In particular, the distal end portion 231a is bent so as to be substantially parallel to the ground conductor of an electronic device when the shield case and/or the circuit board 30 are/is mounted to the electronic device. Note that, FIG. 1 and FIG. 2 illustrate a structure made on the assumption that the shield case and/or the circuit board 30 is/are mounted to the electronic device so that the lower surface of the lower case 20 is substantially parallel to the ground conductor (specific example thereof is described below). Therefore, the distal end portion 231a and the lower surface of the lower case 20 are substantially parallel to each other.

With the above-mentioned structure, the tongue pieces 231 and 232 provided to protrude from the shield case can perform grounding of the shield case. Thus, it is possible to eliminate a gasket and a ground fitting used for the grounding. Therefore, it is possible to perform the grounding easily with a simple structure.

Further, a part of the shield case is bent outward to form each of the tongue pieces 231 and 232. Therefore, it is possible to easily manufacture the shield case including the tongue pieces 231 and 232. In addition, each of the tongue pieces 231 and 232 is formed by cutting some region on a surface of the shield case (lower surface of the lower case 20) and then bending the thus cut region. Consequently, it is possible to easily form the tongue pieces 231 and 232 at arbitrary positions. Further, with this structure, it is possible to form the tongue pieces 231 and 232 only by processing a conventional shield case. Therefore, without changing a conventional structure largely, it is possible to manufacture the shield case including the tongue pieces 231 and 232.

Further, the distal end portion 231a of the tongue piece 231 and the distal end portion 232a of the tongue piece 232 are formed by bending the tongue pieces 231 and 232 so as to be substantially parallel to the ground conductor. As a result, it is possible to increase a contact area between the tongue piece 231 and the ground conductor and a contact area between the tongue piece 232 and the ground conductor, and to realize satisfactory contact. Therefore, it is possible to ground the tongue pieces 231 and 232 effectively.

Note that, the structure of the shield case and the structure of the circuit board 30 illustrated in FIG. 1 and FIG. 2 are merely examples, and hence various modifications may be made. For example, a plurality of elements 40 may be provided inside the shield case, or a shield plate for shielding each of the elements 40 may be provided inside the shield case. Alternatively, for example, the element 40 may be provided not only on the upper surface of the circuit board 30 but also on the lower surface thereof.

Further, the structure in which the tongue pieces 231 and 232 are provided on the same surface (lower surface of the lower case 20) is exemplified. However, the tongue pieces 231 and 232 may be provided on a plurality of surfaces depending on a mode of mounting onto the electronic device and the structure of the ground conductor.

<Image Display Device>

Next, an example of a structure of an image display device is described with reference to the drawings, the image display device being one example of the electronic device to which the above-mentioned shield case and the circuit board 30 are mounted.

Figure 3:
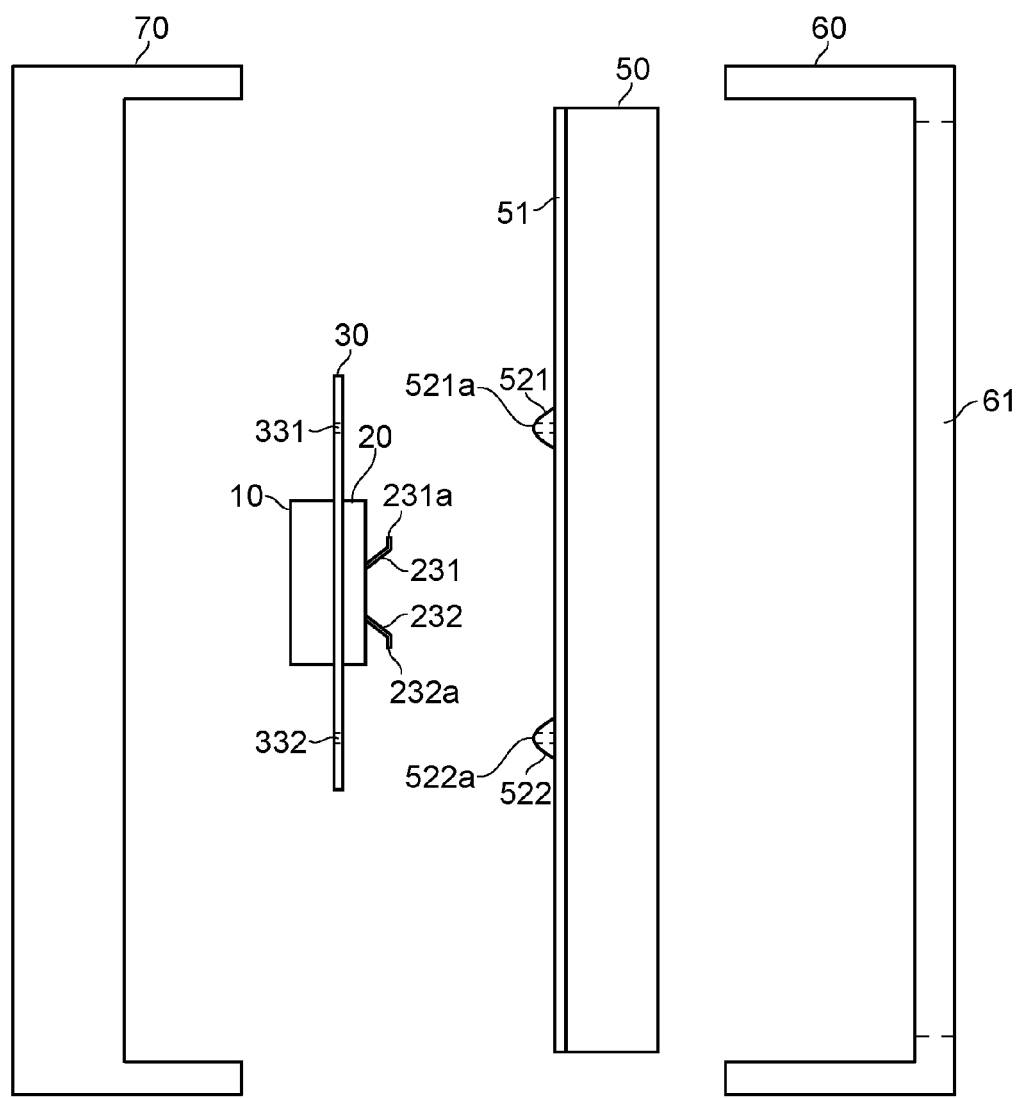
FIG. 3 is an exploded side view schematically illustrating an example of a structure of an image display device according to the embodiment of the present invention.

First, the example of the structure of the image display device is described with reference to FIG. 3. FIG. 3 is an exploded side view schematically illustrating the example of the structure of the image display device according to the embodiment of the present invention. As illustrated in FIG. 3, the image display device includes a display panel 50 for displaying an image on a front surface thereof, a front cabinet 60 serving as a casing provided on the front surface side of the display panel 50, a back cabinet 70 serving as a casing provided on the back surface side of the display panel 50, and the circuit board 30 onto which the above-mentioned shield case is fixed.

In order that the image displayed on the front surface of the display panel 50 is visually recognized from the outside, the front cabinet 60 includes an opened center portion 61. Further, the display panel 50 is formed of, for example, a liquid crystal display panel, and is provided with, for example, a ground conductor 51 provided on the back surface of the display panel to supply a ground potential to the display panel 50. In addition, on the back surface of the display panel 50, bosses 521 and 522 for fixing the circuit board 30 are provided.

The bosses 521 and 522 are formed so as to protrude to the back surface side of the display panel 50. A screw hole 521a through which a screw is inserted from the back surface side is formed in the boss 521, and a screw hole 522a through which a screw is inserted from the back surface side is formed in the boss 522. Further, screw holes 331 and 332 are formed in the circuit board 30. A screw is inserted through each of the screw holes 331 and 332 from the back surface side to the front surface side. Corresponding positional relations are established between the screw hole 521a and the screw hole 331 and between the screw hole 522a and the screw hole 332. Specifically, in the corresponding positional relations, when the screw hole 521a and the screw hole 331 are fixed to each other with a screw, the screw hole 522a and the screw hole 332 can be fixed to each other with a screw.

When the circuit board 30 is fixed to the bosses 521 and 522 with screws, the lower surface of the lower case 20 and the back surface of the display panel 50 are opposed to each other. At this time, the lower surface of the lower case 20 and the ground conductor 51 are substantially parallel to each other, and a clearance (for example, about 3 mm to 5 mm) is formed between the lower surface of the lower case 20 and the ground conductor 51. For that reason, a protruding amount of each of the tongue pieces 231 and 232 protruding from the lower surface of the lower case 20 before the circuit board 30 is fixed to the display panel 50 is set to be equal to or larger than a size of the clearance.

With the above-mentioned structure, only by fixing the circuit board 30 onto the back surface of the display panel 50, it is possible to bring the tongue pieces 231 and 232 into contact with the ground conductor 51 so as to ground the tongue pieces 231 and 232. Therefore, it is possible to simplify a manufacturing process. Further, in the back cabinet 70, it is possible to omit formation of a portion for housing or fixing the shield case and the circuit board 30.

Further, the protruding amount of each of the tongue pieces 231 and 232 is set to be equal to or larger than the above-mentioned clearance. Consequently, when the circuit board 30 is fixed onto the back surface of the display panel 50, the tongue pieces 231 and 232 (in particular, distal end portions 231a and 232a) are brought into press-contact with the ground conductor 51. Therefore, effective grounding is possible.

Further, the clearance can be set to be small, and hence the protruding amount of each of the tongue pieces 231 and 232 can be set to be small. When the protruding amount of each of the tongue pieces 231 and 232 is set to be small, it is possible to increase resistance to external impart and the like (for example, it is possible to suppress a shape change). Therefore, it is unnecessary to use a special material (for example, elastic material) as a material for the tongue pieces 231 and 232 (or entire shield case). Consequently, it is possible to achieve a cost reduction.

Figure 4:
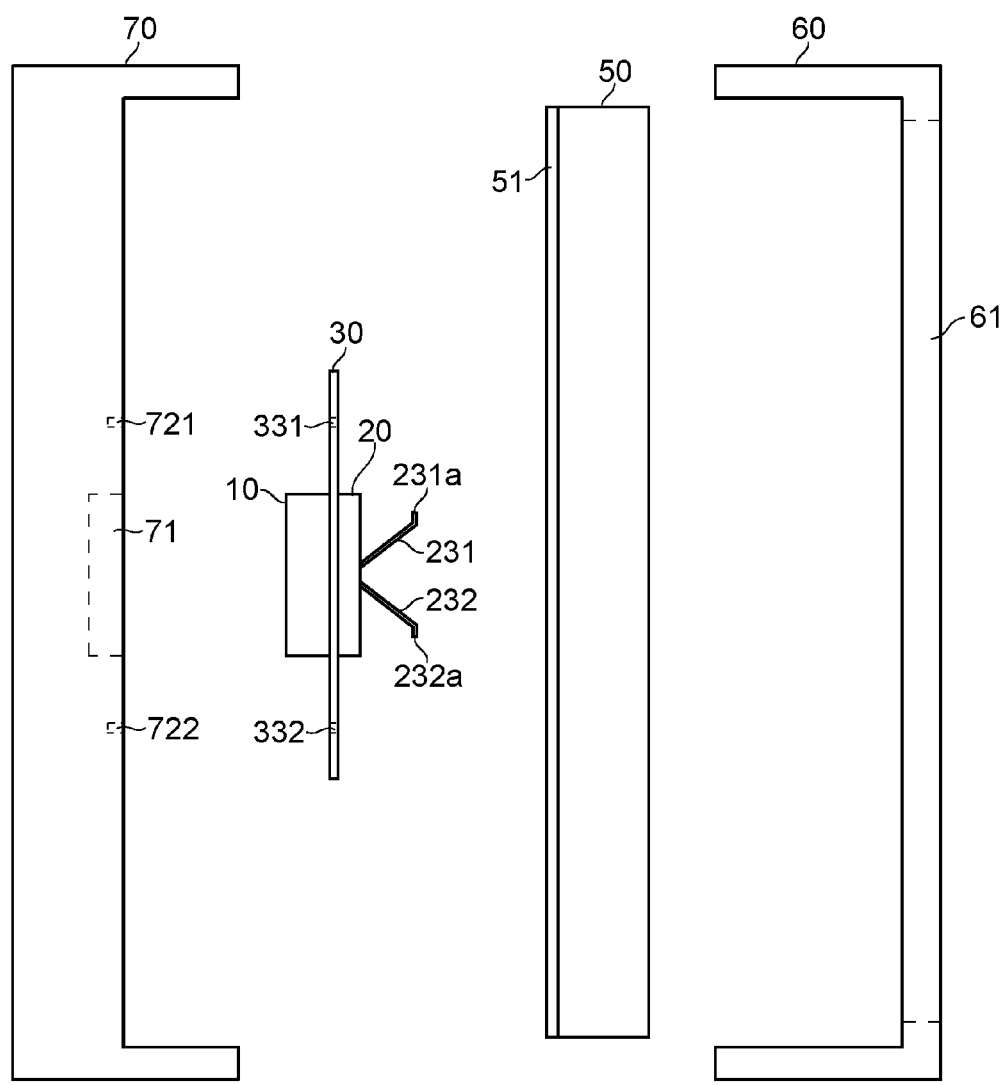
FIG. 4 is an exploded side view schematically illustrating another example of the structure of the image display device according to the embodiment of the present invention.

Note that, the above-mentioned structure is merely an example, and another structure may be adopted. Specifically, for example, a structure illustrated in FIG. 4 may be adopted. FIG. 4 is an exploded side view schematically illustrating another example of the structure of the image display device according to the embodiment of the present invention. FIG. 4 corresponds to FIG. 3 illustrating one example. Note that, the same portions as those of FIG. 3 are denoted by the same reference symbols, and detailed description thereof is omitted.

In the example illustrated in FIG. 4, the circuit board 30 is fixed to the front surface side of the back cabinet 70. Therefore, in the front surface of the back cabinet 70, there are formed screw holes 721 and 722 (which correspond to the screw holes 521a and 522a of FIG. 3 (however, a screw is inserted through each of the screw holes 721 and 722 from the front surface side)) for fixing the circuit board 30 with screws, and there is provided a housing portion 71 for housing the upper case 10.

With the above-mentioned structure, only by fixing the circuit board 30 on the front surface side of the back cabinet 70 and assembling the image display device, it is possible to bring the tongue pieces 231 and 232 into contact with the ground conductor 51 so as to ground the tongue pieces 231 and 232. Therefore, it is possible to simplify the manufacturing process. Further, in the display panel 50, it is possible to omit formation of a portion for fixing the circuit board 30.

By the way, with the structure according to this embodiment, a clearance between the lower surface of the lower case 20 and the ground conductor 51 may be increased (for example, a dozen or so mm) As described above, also in this case, it is preferred to set the protruding amount of each of the tongue pieces 231 and 232 to be equal to or larger than the size of the clearance. However, in a case where there arises a problem in that the protruding amount of each of the tongue pieces 231 and 232 is increased and hence the resistance to external impart is reduced, only by using a special material (for example, elastic material) as a material for the tongue pieces 231 and 232 (or entire shield case), it is possible to deal with the problem of impact without complicating the manufacturing process.

In the above description, the embodiment of the present invention is described. However, the scope of the present invention is not limited to the embodiment, and the present invention can be implemented in various modifications without departing from the gist of the invention.

The present invention relates to a shield case for electromagnetically shielding an element housed inside the shield case, and relates to an image display device including the shield case.

What is claimed is:

1. An image display device, comprising:
    a shield case formed of a conductor, the shield case including at least one tongue piece and a protrusion provided in an edge portion of the shield case;
    an element housed inside the shield case;
    a circuit board on which the element is provided; and
    a display panel including a ground conductor formed on at least a part of a back surface, for displaying an image on a front surface,
    wherein the at least one tongue piece is a bent part of the shield case protruding outside of the shield case and away from the circuit board,
    wherein the protrusion has a corresponding positional relation with a hole formed in the circuit board, and is inserted into the hole,
    wherein the back surface of the display panel and a surface of the shield case on which the at least one tongue piece is formed are opposed to each other, and the at least one tongue piece is brought into contact with the ground conductor, and
    wherein the circuit board is fixed onto the back surface of the display panel so that the at least one tongue piece is brought into press-contact with the ground conductor.

2. The image display device according to claim 1, wherein a distal end portion of the at least one tongue piece is bent so as to be substantially parallel to the ground conductor.

* * * * *